(12) United States Patent
Elkholy et al.

(10) Patent No.: US 10,128,857 B1
(45) Date of Patent: Nov. 13, 2018

(54) SYSTEM, APPARATUS AND METHOD FOR PROGRAMMABLY CONTROLLING GENERATION OF A NOTCH AT A RADIO FREQUENCY USING ARBITRARY PULSE PAIRING

(71) Applicant: Silicon Laboratories Inc., Austin, TX (US)

(72) Inventors: Mohamed Elkholy, College Station, TX (US); Ahmed Emira, Diamond Bar, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/876,651

(22) Filed: Jan. 22, 2018

(51) Int. Cl.
| | |
|---|---|
| *G05F 1/10* | (2006.01) |
| *H03L 7/099* | (2006.01) |
| *H02M 3/157* | (2006.01) |
| *H04J 3/06* | (2006.01) |
| *H04B 1/10* | (2006.01) |
| *H02M 3/158* | (2006.01) |

(52) U.S. Cl.
CPC ............ *H03L 7/099* (2013.01); *H02M 3/157* (2013.01); *H02M 3/1588* (2013.01); *H04B 1/10* (2013.01); *H04J 3/0685* (2013.01)

(58) Field of Classification Search
CPC ...... H02M 3/158; H02M 3/156; H02M 3/157; H02M 3/1588; H02M 2001/0009; H02M 2001/0032; H02M 2001/0058; H03L 7/099
USPC ......... 327/536, 537, 101–103; 323/283, 284, 323/282, 252
See application file for complete search history.

(56) References Cited

U.S. PATENT DOCUMENTS

| | | | | |
|---|---|---|---|---|
| 6,577,110 B2 * | 6/2003 | Van Auken | ......... | H02M 3/1588 323/224 |
| 8,901,908 B2 * | 12/2014 | Tang | ..................... | H02M 3/157 323/283 |
| 9,698,685 B2 | 7/2017 | Calhoun | | |
| 2007/0216378 A1 | 9/2007 | Ozawa | | |
| 2008/0116872 A1 * | 5/2008 | Nakazono | ............... | H02M 1/32 323/284 |

(Continued)

OTHER PUBLICATIONS

Steven Keeping, "The Advantages of Pulse Frequency Modulation for DC/DC Switching Voltage Converters," Electronic Products, Mar. 25, 2014, 4 pages.

(Continued)

*Primary Examiner* — Thomas Skibinski
(74) *Attorney, Agent, or Firm* — Trop, Pruner & Hu, P.C.

(57) ABSTRACT

In one embodiment, a radio receiver includes: a programmable frequency synthesizer to generate a first clock signal; a first frequency divider to divide the first clock signal to generate a master clock signal; a second frequency divider to divide the master clock signal to generate a mixing signal; and a mixer to downconvert a radio frequency (RF) signal to a second frequency signal using the mixing signal. A voltage converter to couple to the radio receiver includes a switch controllable to switchably couple a first voltage to a storage device and a pulse generator to generate at least one pulse pair formed of a first pulse and a second pulse substantially identical to the first pulse, when a second voltage is less than a first threshold voltage, the second pulse separated from the first pulse by a pulse separation interval.

20 Claims, 10 Drawing Sheets

(56) References Cited

U.S. PATENT DOCUMENTS

| | | | | |
|---|---|---|---|---|
| 2011/0267142 A1* | 11/2011 | Wismar | ................ | H02M 3/157 |
| | | | | 330/129 |
| 2012/0126766 A1* | 5/2012 | Chen | .................... | H02M 3/156 |
| | | | | 323/283 |
| 2016/0233869 A1* | 8/2016 | Khoury | ................... | H03L 7/099 |

OTHER PUBLICATIONS

Maxim Integrated Products, Inc., "DC-DC Converter Tutorial," https://www.maximintegrated.com/en/app-notes/index.mvp/id/2031, Nov. 29, 2001, 14 pages.

U.S. Appl. No. 15/352,775, filed Nov. 16, 2016, entitled "Frequency Shaping Noise in a DC-DC Converter Using Pulse Pairing," by John M. Khoury.

* cited by examiner

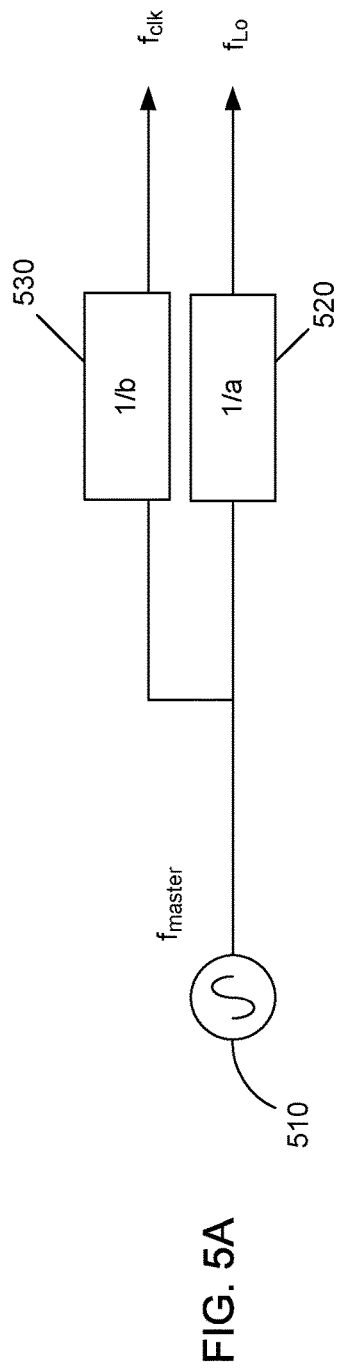
FIG. 5A
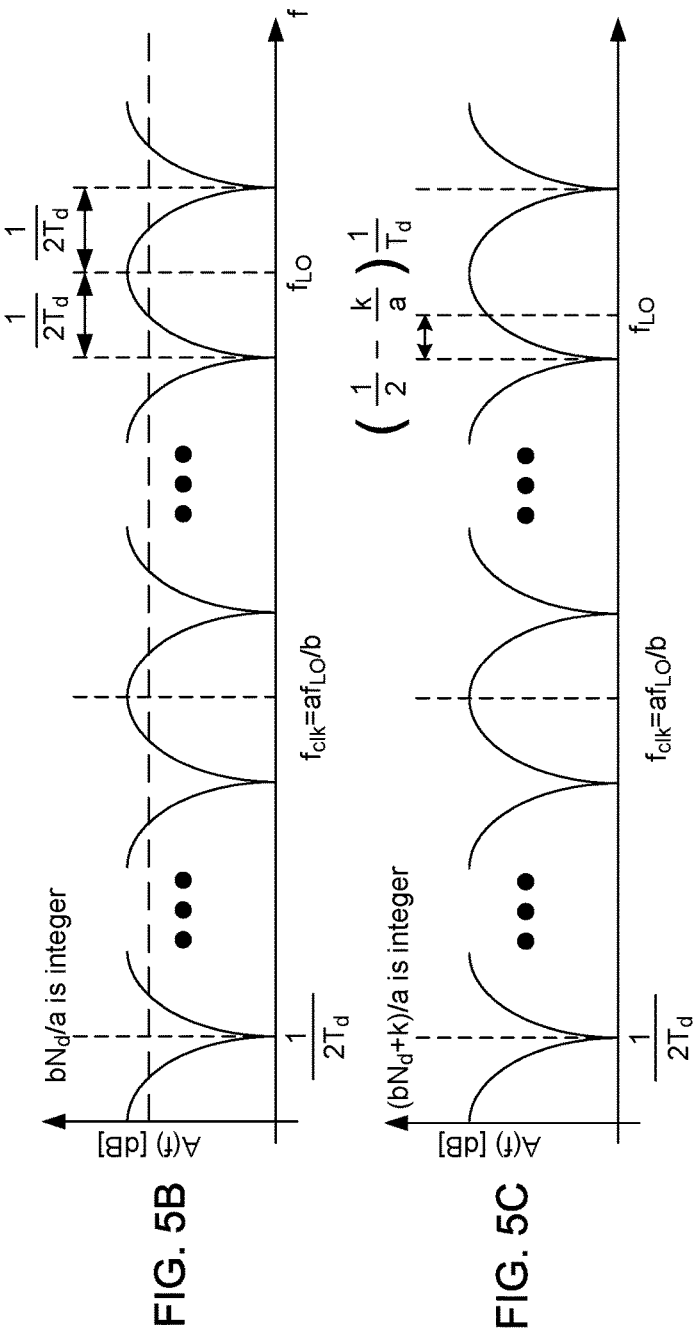
FIG. 5B
FIG. 5C

SYSTEM, APPARATUS AND METHOD FOR PROGRAMMABLY CONTROLLING GENERATION OF A NOTCH AT A RADIO FREQUENCY USING ARBITRARY PULSE PAIRING

BACKGROUND

A DC-DC converter is a form of voltage converter that receives input of a DC voltage and modifies it to output a DC voltage of a different voltage level. Different topologies of converters enable boost and buck operations. DC-DC converters are desirable to use in powering portable devices such as wireless devices, since they can reduce the current drawn from a battery power supply. Many types of DC-DC converters exist, including pulse width modulation (PWM) converters and pulse frequency modulation (PFM) converters. Different converters may be preferable for certain applications. For example, a PFM converter maximizes efficiency over a wider range of load currents than does a PWM DC-DC converter. However, one drawback of a PFM converter is that its switching operations can cause interference in radio frequency (RF) circuits that is difficult to control, since the interfering energy is spread over wide and unpredictable frequency bands.

SUMMARY OF THE INVENTION

According to one aspect, an apparatus includes a radio receiver to receive and downconvert a radio frequency (RF) signal to a second frequency signal. The radio receiver may include: a programmable frequency synthesizer to generate a first clock signal; a first frequency divider to divide the first clock signal to generate a master clock signal; a second frequency divider to divide the master clock signal to generate a mixing signal; and a mixer to downconvert the RF signal to the second frequency signal using the mixing signal. The apparatus may further include a voltage converter to receive a first voltage and provide a second voltage to at least a portion of the radio receiver, the voltage converter having a storage device to store energy based on the first voltage and a switch controllable to switchably couple the first voltage to the storage device, and a pulse generator to generate at least one pulse pair formed of a first pulse and a second pulse substantially identical to the first pulse, when the second voltage is less than a first threshold voltage, the second pulse separated from the first pulse by a pulse separation interval. The at least one pulse pair is to control the switch.

In an embodiment, the pulse separation interval comprises a predetermined value determined without reference to a determination that the second voltage is less than the first threshold voltage. In an example, the master clock signal comprises a retiming clock signal to clock at least one counter of the pulse generator, the pulse separation interval determined according to a value of the at least one counter. The apparatus may further include a third frequency divider to divide the master clock signal to generate a retiming clock signal to clock the at least one counter. The second frequency divider may be a programmable divider, where a product of the pulse separation interval and the second frequency signal is approximated to ($½–k/a$), where k is an integer value and a is a divider ratio of the second frequency divider. A frequency difference between the RF signal and a null frequency may be proportional to an error value of a rounding function. In turn, a may be selectable based at least in part on a frequency of the RF signal.

In an embodiment, the pulse generator comprises a counter to be clocked by the master clock signal, the pulse generator to separate the second pulse from the first pulse according to a value of the counter. The apparatus may further include a third frequency divider to divide the master clock signal to generate a retiming clock signal. At least one of the second frequency divider and the third frequency divider may comprise a programmable divider, where a product of the pulse separation interval and the second frequency signal is approximated to ($½–k/a$), where k is an integer value, a is a divider ratio of the second frequency divider and b is a divider ratio of the third frequency divider, and a and b comprise integer values having no common factor other than one, the counter to be clocked by the retiming clock signal. The second frequency divider may be programmable to output the mixing signal at a plurality of frequencies for a single value of the pulse separation interval. The programmable frequency synthesizer and the second frequency divider may be programmably controlled to output the mixing signal based at least in part on a wireless communication protocol.

In another aspect, a method includes: determining an output frequency for a frequency synthesizer of a radio receiver, a first divider ratio for a first frequency divider of the radio receiver and an intermediate frequency at which the radio receiver is to operate, based at least in part on a RF band and a channel bandwidth associated with the RF band; determining a second divider ratio for a second frequency divider of the radio receiver and a delay counter value based at least in part on the first divider ratio, the intermediate frequency, and a local oscillator frequency, the local oscillator frequency of a mixing signal to downconvert an RF signal to the intermediate frequency; controlling the first frequency divider based on the first divider ratio and controlling the second frequency divider based on the second divider ratio; and controlling a counter of a pulse generator according to a retiming clock signal output by the second frequency divider.

In an embodiment, the method includes accessing a non-volatile storage to obtain one or more of the first divider ratio and the second divider ratio. Controlling the first frequency divider comprises causing the first frequency divider to divide an incoming clock signal by the first divider ratio, the first frequency divider to output the mixing signal at local oscillator clock frequency, and controlling the second frequency divider comprises causing the second frequency divider to divide the incoming clock signal by the second divider ratio, the second frequency divider to output the retiming clock signal, where a first integer value comprising the first divider ratio and a second integer value comprising the second divider ratio have no common factor except one. Controlling the counter comprises clocking at least one counter according to the retiming clock signal and causing the pulse generator to generate a second pulse following a first pulse when a value of the at least one counter reaches the delay counter value.

In another aspect, an integrated circuit includes: a radio receiver to receive, process and downconvert a RF signal including an RF channel to a second frequency signal using a mixing signal, at least one of the second frequency signal and the mixing signal programmable; a digital processor to digitally process the second frequency signal; and a DC-DC converter including a storage device, the DC-DC converter to provide a voltage to the radio receiver, where the DC-DC converter includes a control circuit, when the voltage is less than a threshold voltage, to generate at least one pulse pair formed of a first pulse and a second pulse separated from the first pulse by a pulse separation interval based on a delay counter value, to cause a source voltage to charge the storage device, the delay counter value determined according to a first divider ratio of a first frequency divider that is to generate the mixing signal, a frequency of the mixing signal and a frequency of the second frequency signal, where the pulse pair is to reduce interference at one or more of the RF channel of interest and the mixing signal.

In an embodiment, the control circuit includes: at least one counter to count according to a retiming clock signal output by a second frequency divider having a second divider ratio; and a pulse generator to generate the first pulse and thereafter generate the second pulse when a count value of the at least one counter reaches the delay counter value. The first divider ratio may be a first integer value and the second divider ratio may be a second integer value, the first integer value and the second integer value having no common factor except one. The integrated circuit may further include a controller to dynamically determine the first integer value and the second integer value based at least in part on a frequency of the RF signal and a bandwidth of the RF channel.

BRIEF DESCRIPTION OF THE DRAWINGS

FIG. 5A is a high-level block diagram of a clock generation to perform pulse pairing in accordance with another embodiment.

FIGS. 5B and 5C show the transfer functions applied on the power spectrum of DC-DC noise generated by a retiming clock signal in accordance with another embodiment.

DETAILED DESCRIPTION

In various embodiments, control techniques are provided to reduce or remove interference at RF bands of interest caused by switching of a DC-DC converter. More specifically, embodiments may control PFM control pulses by way of modest timing restrictions, so as to create one or more notches or nulls in a frequency spectrum at a specified frequency or range of frequencies. Specifically in a preferred embodiment, a PFM DC-DC converter is controlled to not output a single pulse of a switching signal, but always to output at least a pair of pulses that have a predetermined delay interval between their start times.

Figure 1:
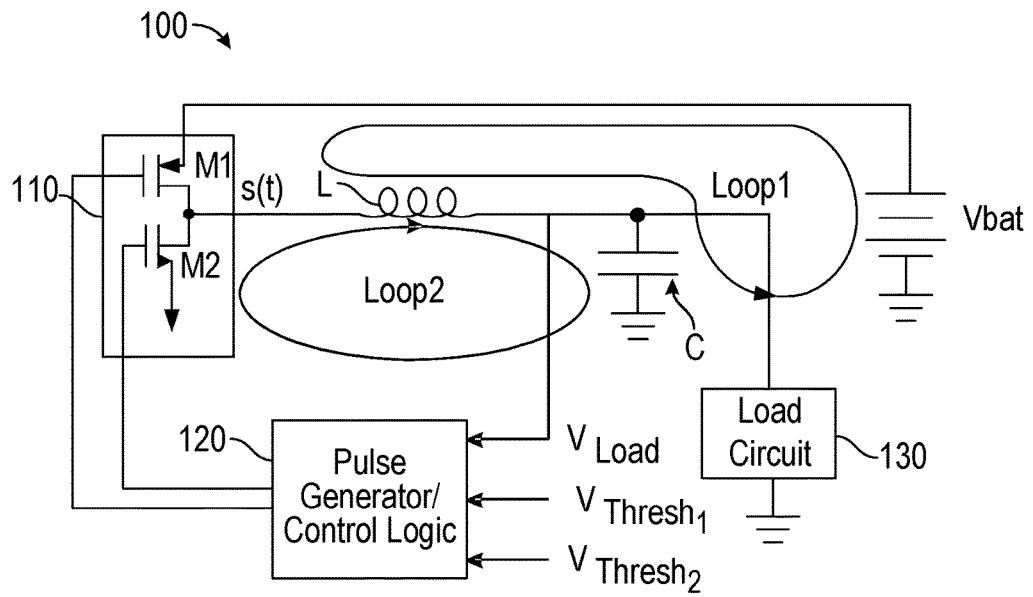
FIG. 1 is a schematic diagram of a DC-DC voltage converter in accordance with an embodiment.

Referring now to FIG. 1, shown is a schematic diagram of a DC-DC voltage converter in accordance with an embodiment. More specifically as shown in FIG. 1, voltage converter 100 is implemented as a DC-DC switching converter. Converter 100 may be adapted on-chip or off-chip depending upon implementation. To provide a load voltage ($V_{Load}$) to a load circuit 130 coupled in parallel with a capacitor C, a source voltage (which may be a battery voltage ($V_{Bat}$)) is applied through an inverter 110 to an inductor L to store energy in capacitor C.

In various embodiments, converter 100 is a pulse frequency modulation (PFM) DC-DC converter. To control the converter according to this PFM operation, a pulse generator/control logic (hereafter "control logic") 120 is provided. In various embodiments, control logic 120 is implemented as hardware circuitry, software and/or firmware and/or a combination thereof. In some cases, control logic 120 may be implemented as part of a controller such as a microcontroller. In some cases, the microcontroller may be a stand-alone small control unit of the switching regulator. In other cases, this controller may be implemented as part of a larger microcontroller, such as a given microcontroller for which switching regulator 100 provides power.

To effect operation such that the load circuit is provided with a substantially steady state DC voltage, control logic 120 compares the load voltage $V_{Load}$ to one or more threshold voltages, which may be based on values stored in a configuration storage. More specifically, control logic 120 is configured to provide two switching signals to control inverter 110 (which may be implemented as a tri-state inverter) to cause the source voltage ($V_{Bat}$ (which may be provided by an off-chip battery source)) to create an inductor current within inductor L to charge capacitor C, such that the load voltage increases.

In different embodiments, converter 100 may be implemented as a PFM regulator which is a particular form of a hysteretic voltage converter. As such, the switching signals may be controlled to cause tri-state inverter 110 (implemented with a pull-up switch and a pull-down switch, shown in FIG. 1 as metal oxide semiconductor field effect transistors (MOSFETs) M1 and M2) to be switched on, where only the pull-up switch or the pull-down switch is active at a time, when the load voltage is below a second threshold voltage (namely a lower threshold voltage (shown in FIG. 1 as $V_{Thresh2}$)) and continue this switching on of inverter 110 using a multi-pulse technique as described herein until the load voltage exceeds a first threshold voltage (namely a high threshold voltage, shown in FIG. 1 as $V_{Thresh1}$) greater than the second threshold voltage, to enable hysteretic operation. When tri-state inverter 110 is switched off, both the pull-up and pull-down switches are off.

Thus when the output of tri-state inverter 110 is pulled up (the pull-up switch is on, while the pull-down switch is off), Loop 1 is active such that current builds up in inductor L charging capacitor C. Instead when the output of tri-state inverter 110 is pulled down (the pull-up switch is off, while the pull-down switch is on), Loop 2 becomes active and the remaining current in L diminishes charging capacitor C till it reaches zero current. When tri-state inverter 110 is off (both the pull-up and the pull-down switches are off), there is zero current flowing in inductor L and capacitor C is discharged by load circuit 130. As such, signal s(t) has 3 levels: (1) high when Loop 1 is active, MOSFET M1 is on, or pull-up; (2) low when Loop 2 is active, MOSFET M2 is on or pull-down; and (3) around $V_{Load}$ with ringing when both MOSFETS are off. The off-state happens in the time when both loops (Loop 1 and Loop 2) are not active. Understand while shown at this high level in the embodiment of FIG. 1, many variations and alternatives are possible. For example, instead of this tri-state inverter, another switching device may be used to receive the switching signal to control switching of the source voltage to one or more energy storage devices of converter 100. One or more diodes also may be provided to control direction of current flow.

Figure 2A:
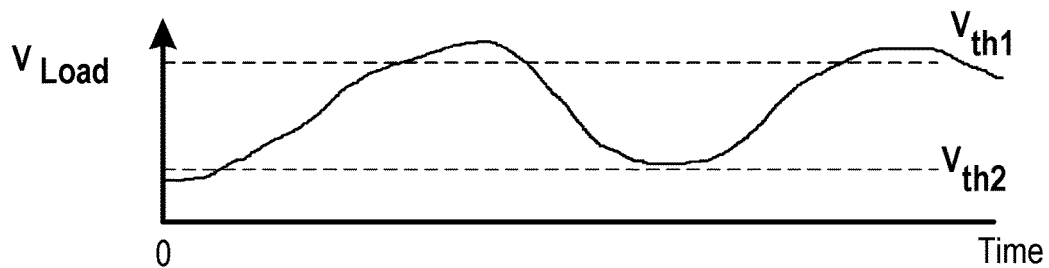
FIGS. 2A-2D are timing illustrations detailing operation of a DC-DC converter in accordance with an embodiment.

Referring now to FIGS. 2A-2D, shown are timing illustrations detailing operation of a DC-DC converter in accordance with an embodiment. As illustrated in FIG. 2A, a varying load voltage is shown over time. As seen, the voltage converter is controlled to maintain the load voltage between a lower threshold voltage level ($V_{Thresh2}$) and a higher threshold voltage level ($V_{Thresh1}$). By providing two threshold voltages, a measure of hysteresis is realized. However in other cases, it is possible to control the voltage converter based on a single threshold voltage. In such cases, the switching regulator may be caused to operate in a charging cycle (tri-state inverter 110 is on) when the load voltage is below the single threshold, and instead operate in a discharging cycle (tri-state inverter 110 is off) when the load voltage exceeds the threshold.

Figure 2B:
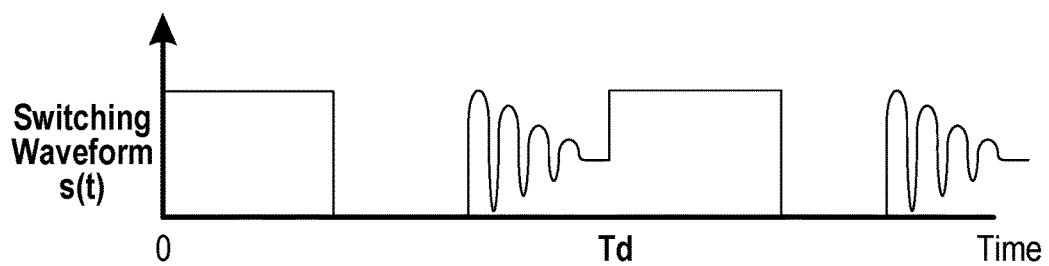

To effect this control a switching waveform s(t) is illustrated in FIG. 2B. As such, when control logic 120 determines that the load voltage is lower than the low threshold level, this switch signal is active to enable charging of capacitor C. In embodiments, instead of a single pulse to effect this control, a pair of pulses, separated by a predetermined time value $T_d$, is used. Note that this time duration, referred to herein also as a pulse separation interval (PSI), is established to control spurious noise caused by the switching waveform to avoid interference at one or more frequencies, such as at a radio frequency (RF) frequency of a channel of interest. That is, embodiments may be used in an RF receiver and/or transceiver in which the DC-DC voltage converter is controlled to operate in a manner to reduce or avoid interference with an RF signal to be received in the RF receiver. Note further that this RF receiver may include signal processing circuitry that operates at one or more intermediate frequencies (IFs) including a low-IF frequency, which may be controlled depending on a band of operation.

Note that while only two pulses of the switching waveform are shown in FIG. 2B, in some cases additional pulses also separated by the same PSI may occur within a given control period. Further understand that in this PFM control of a DC-DC converter, an indeterminate time after such two or more pulses of the switching waveform may occur before another set of two or more pulses of the switching waveform occurs. The pulse width of these two pulses may be identical (or at least substantially identical) in this PFM control of the regulator. In contrast, other DC-DC converters are implemented with pulse width modulation (PWM) control in which the inductor is controlled in a continuous conduction mode (CCM), such that pulses are generated at an identified and fixed frequency, while pulse widths of the pulses of the switching signal may vary. This fixed frequency occurs regardless of the measured value of the output voltage of the switching regulator. That is, in contrast to a PFM converter as described herein, a PWM converter maintains a fixed control interval at which switching signals are initiated, albeit these signals may be of different pulse widths depending upon comparison of the output voltage to one or more threshold voltages.

Note that regardless of a load voltage that exists after a single pulse of the switching signal is generated, the second pulse of the series of two pulses is output, separated by $T_d$. Understand that after this series of (at least) two switching pulses, the load voltage may be determined to be above the appropriate threshold, such that no further issuance of two (or more) switching pulses occurs until the load voltage falls below a target threshold. Instead if, after the two pulses occur separated by the pulse separation interval, it is determined that the load voltage is still below the given target threshold voltage, another series of two pulses may occur. Note that this second series of two pulses may typically occur spaced from the second pulse of the first series of two pulses by an indeterminate time.

Figure 2C:
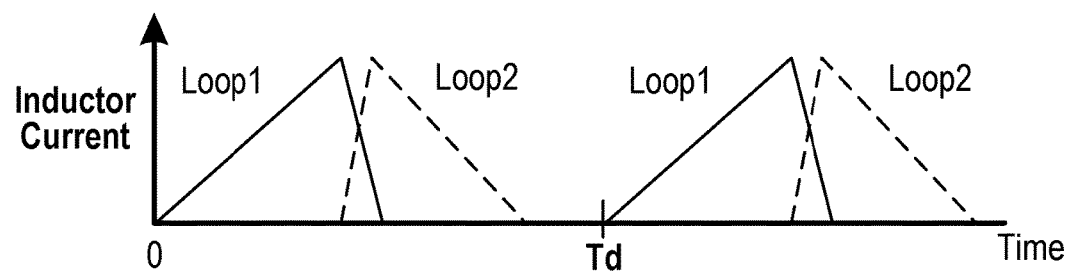

Still with reference to FIGS. 2A-2D, note that when the switching waveform s(t) is active, tri-state inverter 110 is enabled to cause the battery voltage to induce an inductor current $I_L$ in inductor L. In implementations of a PFM converter, as seen in FIG. 2C, when the battery voltage is applied when tri-state inverter 110 is pulled up (and thus Loop 1 is active), the inductor current increases, e.g., linearly from an initial value of zero. That is, in embodiments the DC-DC converter operates in a substantially discontinuous conduction mode (DCM) of operation in which the inductor is controlled so that the inductor current collapses to zero and increases linearly therefrom in each cycle of operation. And when tri-state inverter 110 is pulled down (and thus Loop 2 is active), the inductor current decreases to zero as the magnetic field of inductor L collapses. Tri-state inverter 110 is turned off as a high impedance after the current in the inductor reaches zero pending the activation of another pulse.

Figure 2D:
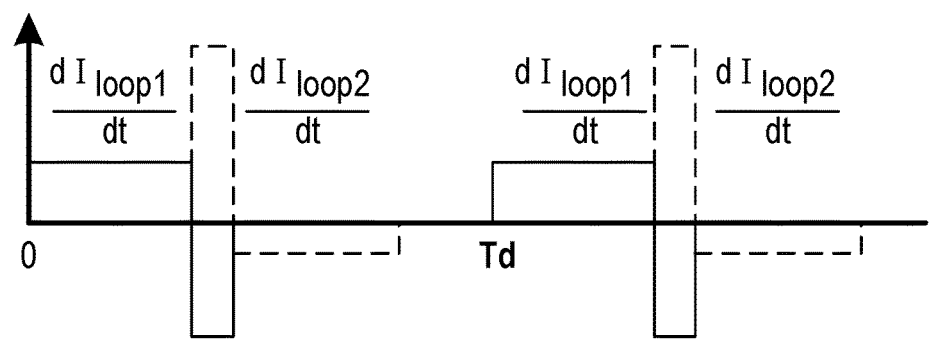

In turn, FIG. 2D illustrates the derivative of the loop currents. As illustrated, when Loop 1 is active (when tri-state inverter 110 is pulled up), a substantially steady loop current pulse occurs, and when tri-state inverter 110 is pulled down and Loop 2 is active, a negative impulse occurs. As to the derivative of the Loop 2 current, note that initially a positive-going pulse occurs with higher amplitude, and then a negative pulse of substantially smaller amplitude occurs. Similar pulses occur for the second pulse of the pulse pair, which occurs at time $T_d$ (namely after a pulse separation interval) from the beginning of the first pulse.

By way of these multiple pulses that occur responsive to detection of a load voltage falling below a given threshold, switching in the DC-DC converter is controlled in a manner to achieve spectral nulls at relevant frequencies, such as at one or more of a center frequency of an RF channel of interest and/or a local oscillator (LO) frequency of a mixing signal used to downconvert the RF signal to a lower frequency signal (e.g., to downconvert the RF signal to an IF signal).

In some cases, the switching waveform can be controlled to cause the different pulse widths of the derivative current pulses shown in FIG. 2D to have specific characteristics to create spectral nulls at desired frequencies (e.g., at one or more of an LO frequency and an RF frequency for a channel of interest). However, such control may be difficult in practical implementations. This may be so, given that the high amplitude derivative current pulses are of relatively short duration (e.g., potentially on the order of nanoseconds).

Instead, embodiments may reduce or remove RF interference triggered by switching operations of the DC-DC converter by controlling the pulse separation interval between pairs of these pulses, such that the noise created by the first pulse is cancelled by the noise created by the second pulse, leading to null energy at one or more frequencies of interest.

Figure 3A:
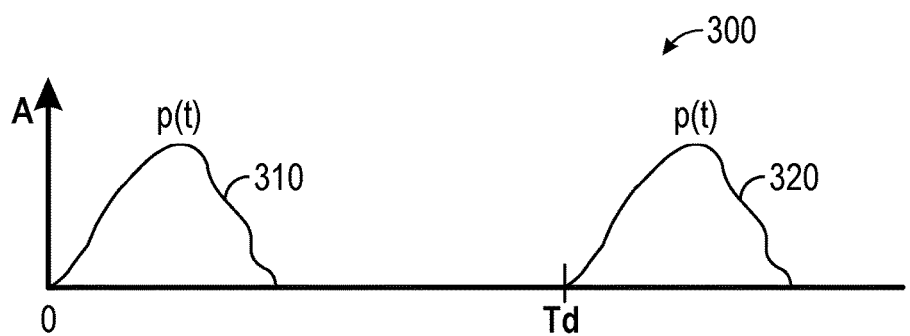
FIG. 3A is a graphical illustration of a pair of arbitrary pulses in accordance with an embodiment.

Referring now to FIG. 3A, shown is a graphical illustration of a pair of arbitrary pulses. Note that these arbitrary pulses are illustrated to show that any type of arbitrary pulse shape (such as the square wave switching signal provided to one or more switches of a DC-DC converter as used herein) can be used to effectively provide a null or notch at one or more desired frequencies. Specifically, FIG. 3A illustrates a pulse pair 300 including a first pulse 310 and a second pulse 320. Note that these arbitrary pulses (p(t)) may be of any type of pulse shape. Furthermore, note that these pulses are generated at an interval corresponding to $T_d$, namely a pulse separation interval.

Understand that while pulses 310 and 320 shown in FIG. 3A are substantially identical (as they may be generated by the same component and at similar circuit environment conditions), in other embodiments two or more pulses can be generated at a pulse separation interval in a manner to reduce or remove undesired interference at one or more RF frequencies. That is, in other cases pulses having different shapes and sizes (amplitudes) can occur, with a second or more of the pulses being generated in a manner with a different shape/amplitude than a first pulse in order to cancel undesired energy at these higher frequency bands.

Furthermore, while the above discussion as to FIG. 3A is in the context of selecting a pulse separation interval with regard to an LO frequency, in some cases a modification or perturbation of this value (e.g., with an IF frequency of a resulting downconversion) can occur to more effectively reduce or remove energy at an RF channel of interest. More specifically, the selection of the pulse separation interval may occur in a manner to ensure that a notch is realized at a given RF frequency (namely at a center channel of a desired RF channel (e.g., a center channel of a wireless band of interest for an associated radio receiver)).

Figure 3B:
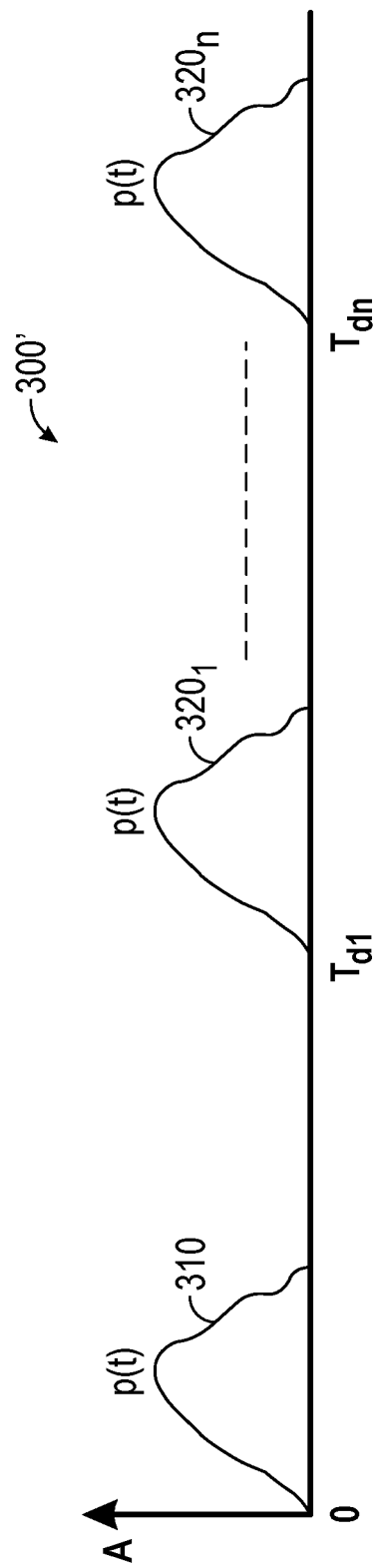
FIG. 3B is a graphical illustration of a generalized view of pulse sequencing as described herein.

Referring now to FIG. 3B, shown is a graphical illustration of a generalized view of pulse sequencing as described herein. More specifically, in FIG. 3B, a pulse sequence 300' having a set of pulses 310, $320_1$-$320_n$ is provided. In this generalized view, it is possible that more than two pulses are provided, each separated from the preceding pulse by a pulse separation interval, $T_{d1}$-$T_{dN}$, where each of these pulse separation intervals may be substantially identical or may vary depending upon embodiment.

With proper design of the value of $T_{di}$, an overall shaping filter with notches or regions of large attenuation can be created (essentially, an FIR filter can be created to arbitrarily shape the spectrum). Note however that this filtering operation is not an express filter within or used by the DC-DC converter. Instead, the control logic that generates a pulse sequence according to this determined pulse separation intervals enables this filtering to occur at RF frequencies by noise cancellation effected by control of the pulse separation interval.

Thus embodiments provide a PFM DC-DC comparator that creates spectral nulls at desired locations in the RF (or other) frequency band with arbitrary transient current waveform pulses, provided that a predetermined number of substantially identical pulse(s) follow the initial pulse after a predetermined and fixed delay interval. In a specific case, a single pulse may follow an initial pulse with a delay that has a prescribed relationship to the LO frequency in order to place a null at or near the LO frequency and/or its harmonics. The delay of all pulse pairs may be identical for a specific LO frequency and intermediate frequency. Superior interference suppression at a given frequency can be achieved if the duration (and shape) of each individual current pulse is of a controlled duration. While the pulse pairing technique described herein is with regard to PFM DC-DC converters, understand that embodiments are applicable to various systems that have repetitive transient responses. If transient responses are substantially identical each time, then restricting start times of transients (with pulse-to-pulse delay) can eliminate noise in a desired frequency band. One such example could be a general-purpose-input-output (GPIO) output signal that creates a clock signal or communicates data, where a logic zero means sending no pulses and a logic one means sending a pulse pair.

Figure 4A:
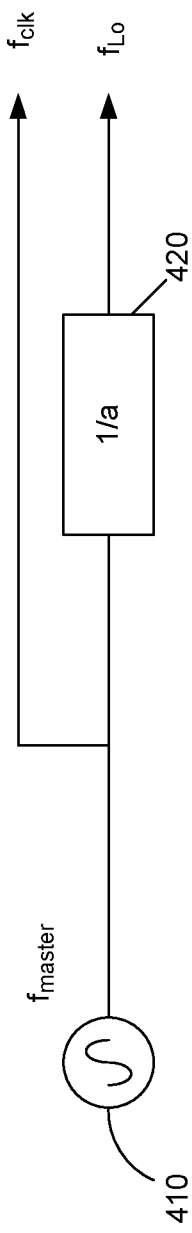
FIG. 4A is a high-level block diagram of clock generation to perform pulse pairing in accordance with an embodiment.

In one embodiment, pulse pairing may be performed with a retiming clock signal used to control a pulse generator as described herein. This retiming clock signal may have a retiming clock frequency that operates at a frequency of $f_{clk}=a \times f_{LO}$, where a is a division ratio and may be a given predetermined integer value, and $f_{LO}$ is a local oscillator frequency of a local oscillator clock signal. Referring now to FIG. 4A, shown is a high-level block diagram of clock generation to perform pulse pairing in accordance with an embodiment. In this embodiment, a master clock signal ($f_{clk}$) is used to retime the arbitrary pulses defining the delay between the paired pulses. Specifically as illustrated in FIG. 4A, a master clock signal 410 ($f_{master}$) may itself be used as the retiming clock signal ($f_{clk}$). Note that as described further herein master clock signal 410 itself may be generated from an output of a frequency synthesizer such as a phase locked loop (PLL), and possibly a frequency divider (such as a divide by 2 divider). As further shown a frequency divider 420, which implements a divide by a operation, is used to generate the LO clock signal having the LO frequency ($T_{LO}$). As will be described further herein, in turn this LO clock signal may be used as a mixing signal for downconverting incoming RF signals to a lower frequency, e.g., a given IF frequency ($f_{IF}=f_{LO}-f_{RF}$), at which low-IF processing circuitry of the receiver operates.

For $$f_{clk} = a \times f_{LO},$$

$$n = \text{round}(n') = \text{round}\left(f_{RF} T_d + \frac{1}{2}\right) = \text{round}\left(\left(\frac{N_d}{a} + \frac{1}{2}\right) - T_d f_{IF}\right)$$

where $N_d$ is an integer number defining the number of cycles of clock $f_{clk}$ to determine a delay value $T_d$, n represents the integer number of the null frequency in transfer function A(s) that is closest to $f_{RF}$, such that $$f_n = \frac{1}{T_d}\left(n - \frac{1}{2}\right),$$

and n' represents $f_{RF}$ such that the difference between $f_{RF}$ and $f_{null}$ is proportional to the error in the rounding function.

In case $$\frac{N_d}{a}$$

is an integer value, $$n' - n = \frac{1}{2} - T_d f_{IF},$$

and n'−n=0 when $$T_d f_{IF} = \frac{1}{2}.$$

For $$\frac{N_d + k}{a}$$

being an integer value where k is an integer number, $$n' - n = \left(\frac{-k}{a} + \frac{1}{2}\right) - T_d f_{IF},$$

and n'−n=0 when $$T_d f_{IF} = \left(\frac{1}{2} - \frac{k}{a}\right).$$

Figure 4B:
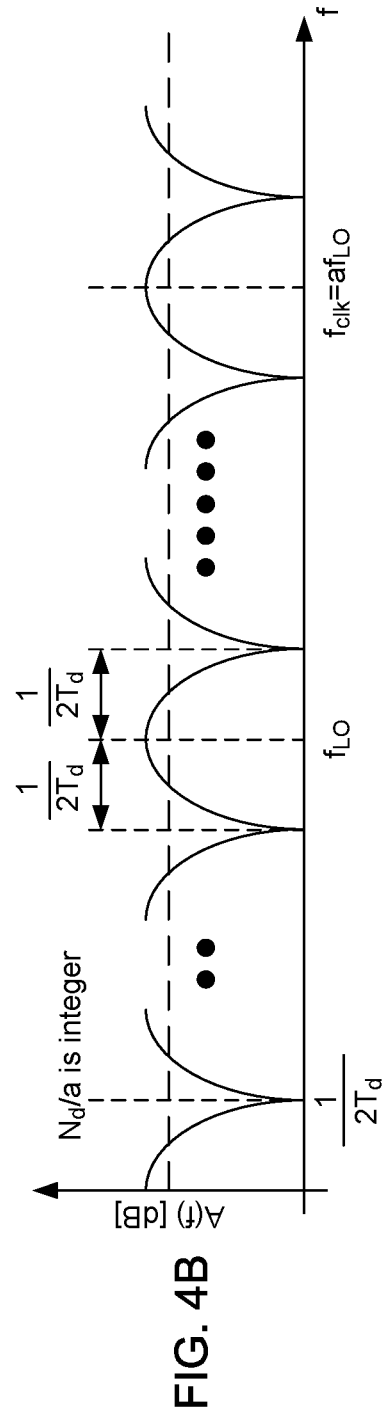
FIGS. 4B and 4C show the transfer functions applied on the power spectrum of DC-DC noise generated by a retiming clock signal in accordance with an embodiment.
Figure 4C:
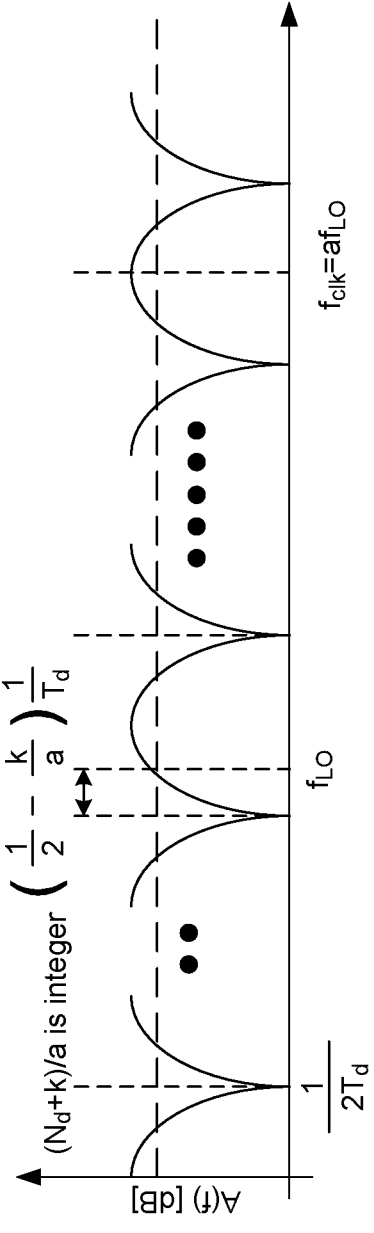

FIGS. 4B and 4C show the transfer functions applied on DC-DC noise power spectrum generated by pulse pairing with this retiming clock signal. As illustrated in these figures, nulls may occur based on a condition that $N_d/a$ is an integer, or $(N_d+k)/a$ is an integer. Note however, with this technique a higher frequency signal (namely $f_{clk}$) is used for retiming.

In another embodiment, pulse pairing may be performed with a retiming clock signal that operates at a retiming clock frequency of $f_{clk}=(a/b) \times f_{LO}$, where a and b have no common factor except for 1. In this case, $f_{clk}$ and $f_{LO}$ have a common multiple ($f_{master}$), where $f_{master}=a \times f_{LO}=b \times f_{clk}$. Using a lower frequency $f_{clk}$ saves power consumption.

FIG. 5A is a high-level block diagram of a clock generation to perform an implementation of pulse pairing with a relaxed condition for the relation between $T_d$ and $f_{IF}$, having a lower retiming frequency. As shown in FIG. 5A, a master clock signal 510 is provided to two different programmable frequency dividers. Namely, a first frequency divider 520 performs a divide by a operation, as discussed above with regard to FIG. 4A, to generate the LO clock signal at a frequency of $f_{LO}$. In addition, a second frequency divider 530 performs a divide by b operation to generate the retiming clock signal at a retiming clock frequency of $f_{clk}$ (in this case, at a frequency different than the master clock signal). In an embodiment, second frequency divider 530 may be implemented as a fixed frequency divider, such that b and a do not have common factor (except for 1). In other embodiments, second frequency divider 530 (and first frequency divider 520) may be implemented as multi-modulus dividers.

For $$f_{clk} = \frac{a}{b} \times f_{LO},$$

$$n = \text{round}(n') = \text{round}\left(f_{RF} T_d + \frac{1}{2}\right) = \text{round}\left(\left(\frac{N_d b}{a} + \frac{1}{2}\right) - T_d f_{IF}\right)$$

In case $$\frac{N_d b + k}{a}$$

being an integer value with k is an integer, $$n' - n = \left(\frac{-k}{a} + \frac{1}{2}\right) - T_d f_{IF},$$

and
thus n'−n≈0 when $$T_d f_{IF} \approx \left(\frac{1}{2} - \frac{k}{a}\right).$$

Assume $f_{master}=2.5$ GHz and b=13, a can have any value except for multiples of 13, and $f_{clk}=192.31$ MHz. For a=8 and $f_{LO}=312.5$ MHz, n'−n≈0 when $T_d f_{IF}$ is near 0 or multiples of ⅛. Therefore, having a second frequency divider 530 as in the embodiment of FIG. 5A achieves nearly same performance as in the above-described embodiment of FIG. 4A, but with a lower retiming frequency.

FIGS. 5B and 5C show the transfer functions applied on DC-DC noise power spectrum generated by pulse pairing with this retiming clock signal. As illustrated in these figures, nulls may occur based on a condition that $N_d b/a$ is an integer, or $(N_d b+k)/a$ is an integer.

Figure 5D:
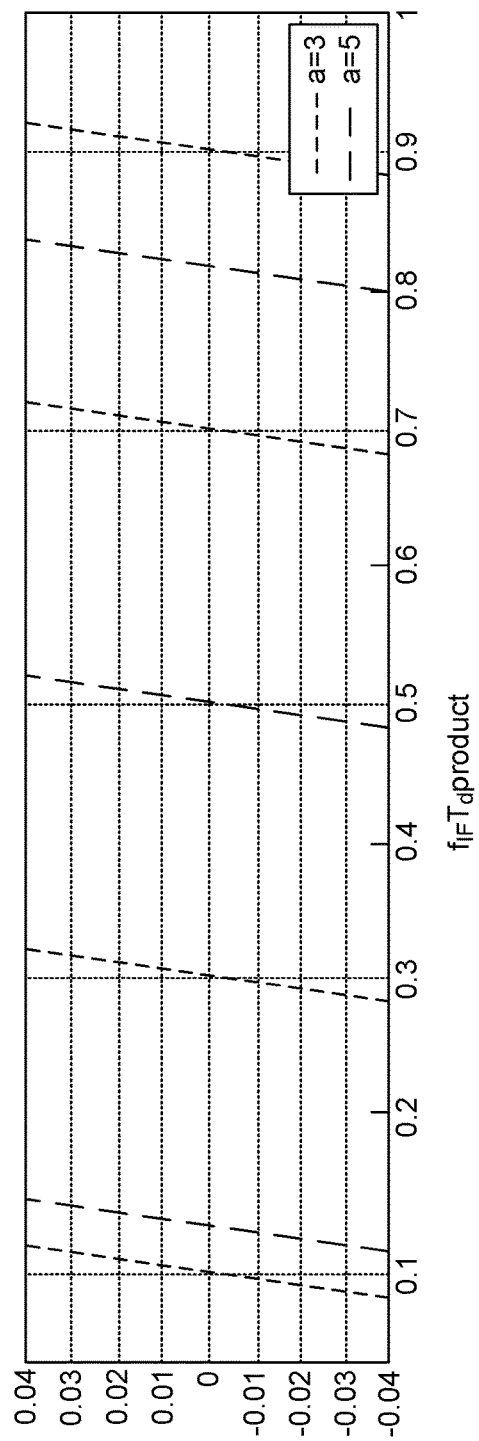
FIGS. 5D and 5E are illustrations of relations showing zero crossings for various values of a in accordance with an embodiment.
Figure 5E:
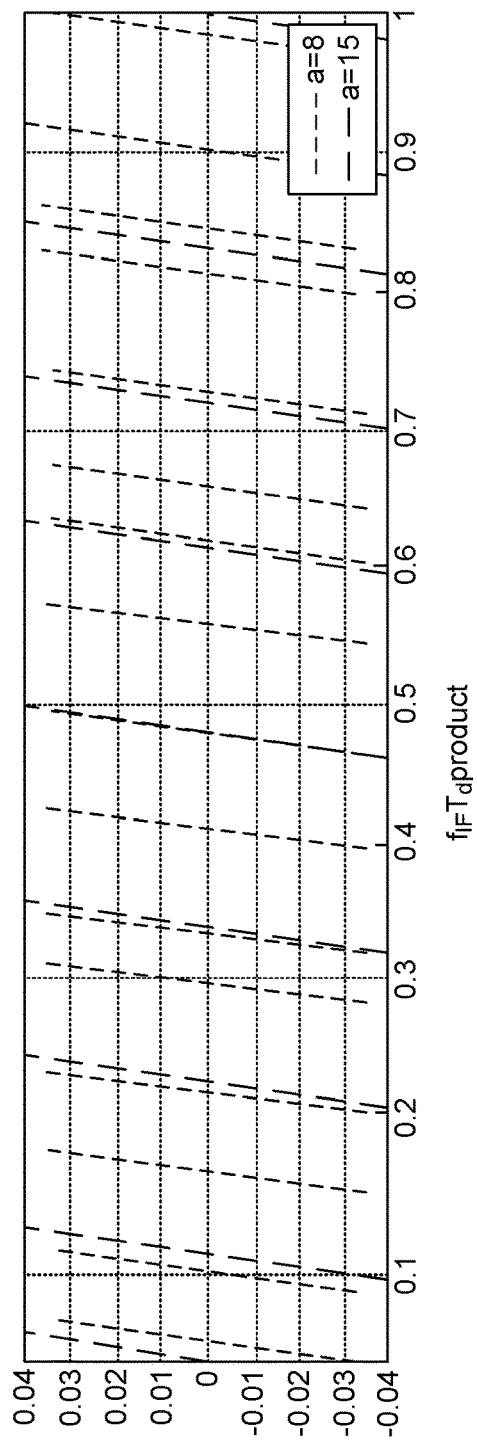

Referring now to FIGS. 5D and 5E, shown are illustrations of relations showing zero crossings for various values of a. More specifically, as shown in FIG. 5D, relatively few numbers of zero crossings occur for values of a being 3 or 5. In this illustration, the X-axis is represented as a product of $f_{IF} T_d$, while the Y-axis is represented as n'−n. Note that this illustration is shown with the number of zero crossings to achieve 15 dB of attenuation in the noise level (where |n'−n|<0.04). As such, with a relatively small division ratio a, a wider range of delay is needed to support any IF frequency. Instead with higher values used for a (namely a=8 and a=15), a greater number of zero crossings is realized, as shown in FIG. 5E. Note that in both FIGS. 5D and 5E, the number of zero crossings is the same as the division ratio a assuming that these curves are periodic with period 1. The reason for the periodicity is shifting the operation to the next null frequency, which is shifted by $1/T_d$.

Using pulse pairing as described herein with a variable delay of different pairs of pulses, nulls may be generated according to:

$$f_n = \frac{\omega_n}{2\pi} = \left(n - \frac{1}{2}\right)\frac{1}{T_d}.$$

As one example, assume that $f_{vco}=2 \times f_{master}=2 \times a \times f_{LO}$ and $f_{vco}=2 \times b \times f_{clk}$, such that $f_{vco}$ may operate at approximately 5.2 GHz. Note in this instance that $f_{vco}$ may correspond to an output of a master oscillator such as a PLL. As briefly mentioned above and described further below in particular embodiments, the output of this VCO or PLL in turn may be provided to a fixed frequency divider (e.g., a divide by 2 divider), where the divided clock signal output by this fixed frequency divider in turn may be provided to the one or more programmable frequency dividers that are used to generate a LO clock signal and a retiming clock signal. With this condition, for $f_{clk}$ to be at approximately 200 MHz, b may be selected to be 11 or 13. In turn, a may be any positive integer other than 1 or multiples of b.

A control circuit such as a microcontroller or other control logic may dynamically calculate a value of $N_d$ to be used for a given $f_{LO}$ band and $f_{IF}$. This control circuit may thus enable dynamic control of pulse pairing with different pulse separation intervals based at least in part on a given RF frequency channel of interest and a desired IF frequency at which a receiver is to operate (which itself may be based at least in part on a particular wireless communication protocol). As such, the control circuit may determine a value for $N_d$ to realize a minimum error of $|n'-n|$. For example, assume $f_{LO}$ is at 169 MHz, and $f_{IF}$ is at 0.3 MHz. In this case, selecting b=13 and a=15 results in $N_d$=167, n'=144.976 and n=145. With an error of −0.024 (between n' and n), this leads to a frequency delta of −28 kHz. Note that this determination of appropriate $N_d$ value may occur to determine an optimum n value while the predetermined pulse separation interval is maintained within a given range. As one such example, $T_d$ may remain in a range of between approximately 0.8 microseconds (μs) to 0.95 μs.

Figure 6A:
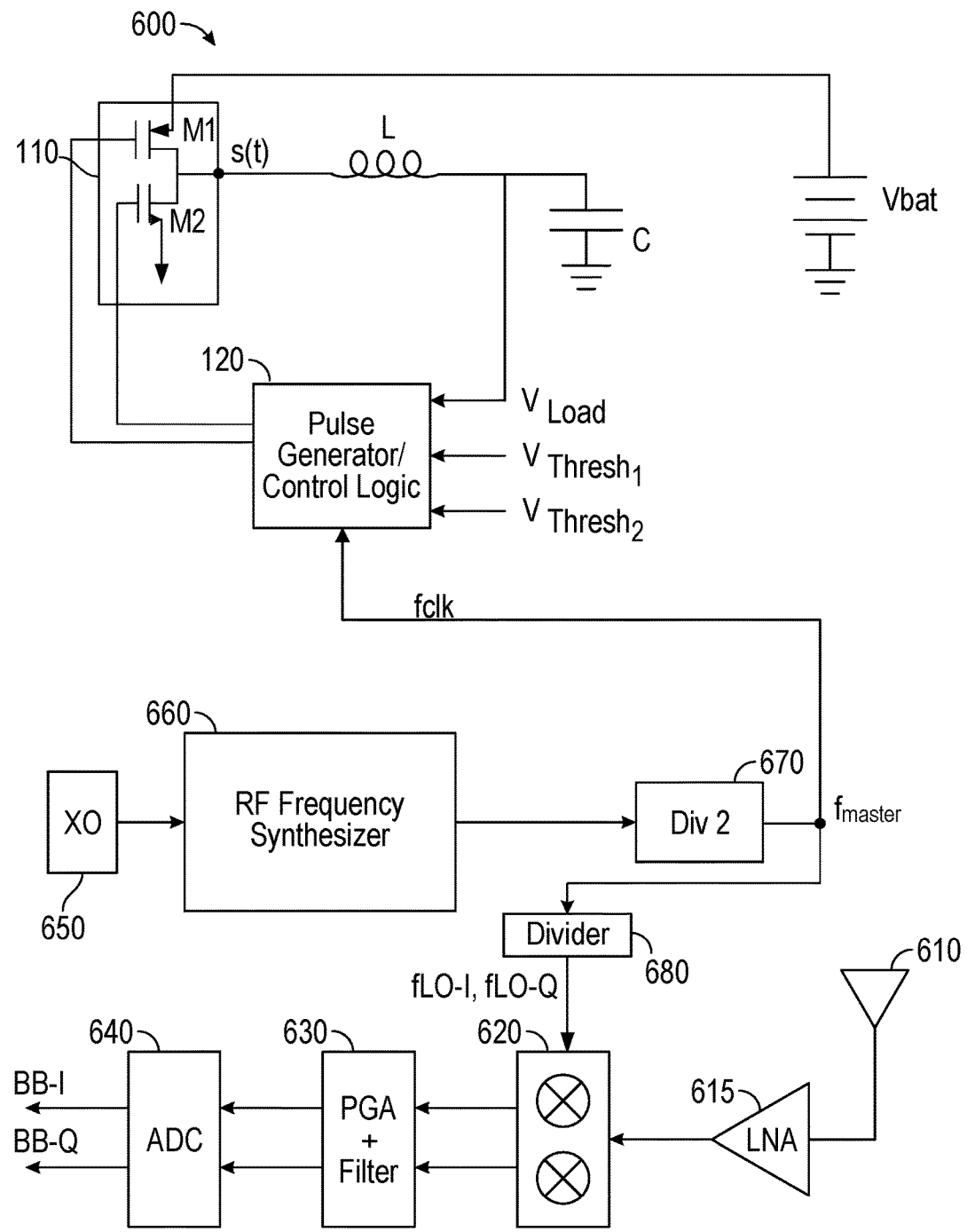
FIG. 6A is a block diagram of a system in accordance with an embodiment.

Referring now to FIG. 6A, shown is a block diagram of a system in accordance with an embodiment. In FIG. 6A a radio receiver system 600 includes a DC-DC converter as described herein. More specifically, receiver system 600 may be implemented as a low-IF receiver that receives an RF signal via an antenna 610, which provides the RF signal to a low noise amplifier 615 that increases a signal level of the RF signal and provides it to a mixer 620. In the embodiment shown, mixer 620 is a complex mixer configured to downconvert the RF signal to a given IF frequency. As illustrated, mixer 620 also receives quadrature mixing signals $f_{LO-I}$ and $f_{LO-Q}$.

As illustrated, the downconverted IF signals are output from complex mixer 620 and are provided to a programmable gain amplifier 630, which may also implement an IF filter. The resulting processed signals are provided to an analog-to-digital converter 640, where the signals are digitized and output as baseband complex signals, namely BB-I and BB-Q.

In the embodiment shown, a crystal oscillator 650 provides a reference clock signal (e.g., at 38.4 MHz) to a frequency synthesizer 660 which, in an embodiment may be implemented as a phase-locked loop (PLL). Frequency synthesizer 660 may generate an RF clock signal based on this reference clock signal. Although different values are possible, in one particular example, frequency synthesizer 660 may generate the RF clock signal at a frequency of approximately 4.8 GHz. As illustrated, this RF clock signal is provided to a frequency divider 670 which, in an embodiment may be implemented as a divide by 2 divider to generate a master clock signal ($f_{master}$). In an embodiment, this master clock signal, which may be at a value of 2.4 GHz, is provided to another frequency divider 680. In the embodiment shown, frequency divider 680 may be implemented as a programmable or configurable frequency divider to divide the master clock signal by a programmable value a (where a is a given integer value), e.g., derived as described herein. As seen, the resulting divided master clock signal is provided as local oscillator signals, namely quadrature mixing signals $f_{LO-I}$ and $f_{LO-Q}$ are provided to mixer 620.

As further illustrated, the master clock signal output by frequency divider 670 is provided as a retiming clock signal to pulse generator/control logic 120. In an embodiment, this clock signal may be used to define where the second pulse of a pulse pair occurs. This clock may be configured as a sample clock for a counter. Thus when the output of a comparator of the DC-DC converter requests to put out a pulse pair, the pulse timing interval may be determined using this retiming clock signal. In particular embodiments, pulse generator/control logic 120 may include one or more counters that are to be clocked by this retiming clock signal. Pulse generation is to occur when the output voltage falls below a given threshold. Specifically, at least one pulse pair separated by a pulse separation interval $T_d$ may be generated. To this end, issuance of the second pulse may occur based at least in part on the output of one or more of these counters (namely when a counter value reaches $N_d$). While an embodiment as in FIG. 6A may suitably provide timing control for generating pulse pairs as described herein, there may be a power consumption cost by communication of this relatively high master clock signal (e.g., which may be at a value of 2.4 GHz) to pulse generator 120. As such, in other embodiments, a reduced frequency clock signal may be provided to such circuitry.

Figure 6B:
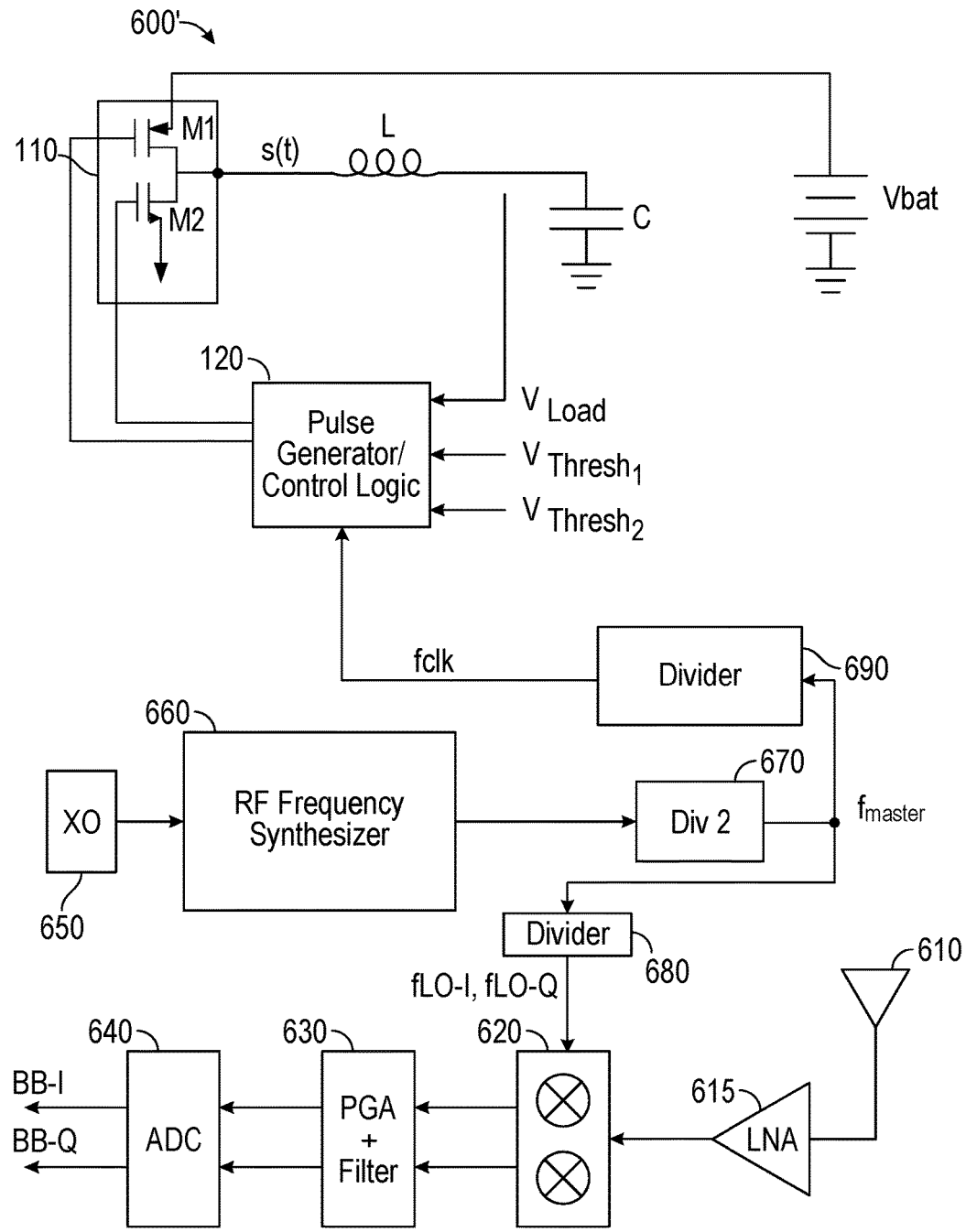
FIG. 6B is a block diagram of a system in accordance with another embodiment.

Referring now to FIG. 6B, shown is another implementation of a circuit in accordance with an embodiment. More specifically, FIG. 6B shows a circuit 600', which may be configured similarly as in FIG. 6A, but with the addition of another frequency divider. That is, to reduce the frequency of the retiming clock signal provided to pulse generator/control logic 120, an additional frequency divider 690 is coupled to an output of frequency divider 670. As such, a retiming clock signal with a reduced frequency is provided to pulse generator/control logic 120. In various embodiments, frequency divider 690 may be implemented as a programmable frequency divider that divides the master clock signal by a given integer value b. In embodiments herein, there may be a relation between this divider ratio and the divider ratio of frequency divider 680, such that b and a (namely the divider ratios of the two dividers) do not have a common factor (except for one). Although examples are not limited in this regard, in an embodiment, b may have a value of 13, and a may have any value except for 1, 13 or multiples of 13. Of course other examples are possible. For example, a may have values of 2-10, 12, or 14-16, while b may have values of 11 or 13. In the particular implementation shown in FIG. 6B, assume that frequency synthesizer 660 generates a clock signal between approximately 4.67 GHz and 5.74 GHz. And more particularly, assume that this RF clock signal is at a frequency 5.2 GHz. After frequency division by two in frequency divider 670, division within frequency divider 690 with a ratio of 13 leads to a retiming clock signal of approximately 200 MHz. And in turn, assuming a division ratio of 15 in frequency divider 680, a local oscillator signal may be generated having a LO frequency of approximately 173 MHz.

Figure 7:
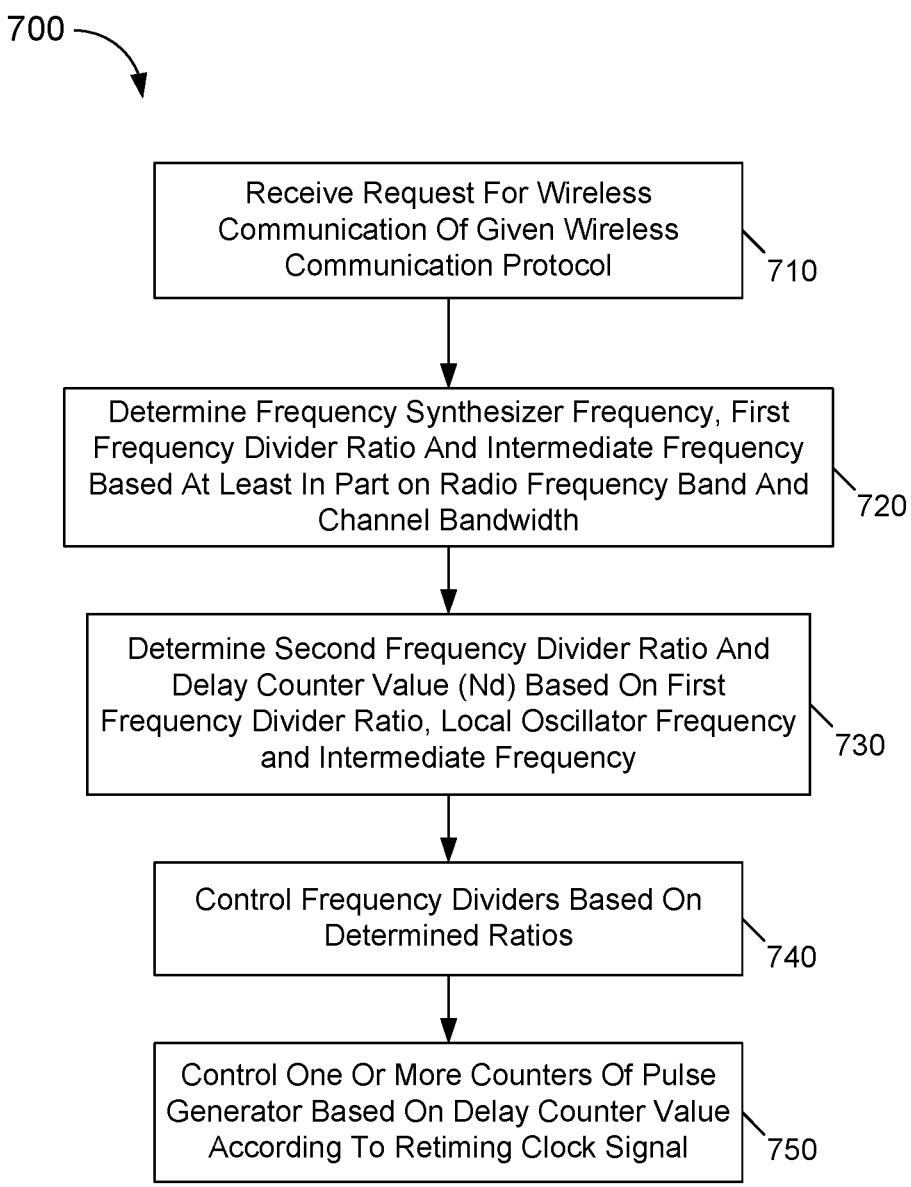
FIG. 7 is a flow diagram of a method in accordance with an embodiment.

Referring now to FIG. 7, shown is a flow diagram of a method in accordance with an embodiment. More specifically, method 700 of FIG. 7 may be performed by a control logic of a radio receiver during receiver operation to determine frequency divider ratios, internal control frequencies, and a pulse separation interval as described herein. In other cases, note that method 700 may be performed during manufacturing activities, based on design characterization, field testing or so forth to identify appropriate pulse separation intervals and other configuration values at a variety of frequency bands to generate and store a table in a storage of the radio receiver to enable pulse control operations as described herein.

As illustrated, method 700 begins by receiving a request for wireless communication of a given wireless communication protocol (block 710). Note that this communication request may be received dynamically. Or, when an integrated circuit including a receiver as described herein is implemented into a fixed system that communicates only according to a single protocol (such as a WiFi, Bluetooth™, Zigbee™ or other protocol), this determination may be set. In any event, control next passes to block 720 where a frequency for a frequency synthesizer, a first frequency divider ratio (namely for a divide by a divider) and an IF frequency all may be determined based at least in part on an RF band and channel bandwidth. That is, particular communication protocols may call for RF signaling to occur at a given RF frequency and further these protocols may have particular channel bandwidths. Different manners of determining these values based on this identified RF band and channel bandwidth may occur. For example, reference may be made to a table stored in non-volatile memory based upon this identified RF frequency and channel bandwidth. Or a selection can be made from a range of appropriate values. In an embodiment, based on available values for a, $f_{LO}$, $f_{IF}$, and b, the value of $N_d$ may be determined such that it satisfies the condition that $$\frac{N_d b + k}{a}$$

is an integer and n'−n≈0. Note that $N_d$ that achieves minimum error may be determined by sweeping $N_d$ values to reach a minimum error, or approximative equations may be used to find $N_d$ from $f_{IF}$.

Still with reference to FIG. 7, control next passes to block 730 where another frequency divider ratio (namely a divide by b ratio) and a delay counter value ($N_d$) may be determined based on the first frequency divider ratio, the LO frequency and the IF frequency, as discussed above. Again, reference may be made to table entries in a non-volatile storage to determine these parameters. Or calculations may be made as discussed above. For example, knowing a, $f_{if}$ and $f_{LO}$, the two equations of $$n = \frac{N_d b + k}{a}$$

and $$n' - n = \left(\frac{-k}{a} + \frac{1}{2}\right) - \frac{N_d b}{a} \frac{f_{IF}}{f_{LO}} \approx 0,$$

may be used to find integers $N_d$ and k such that 0.8 µs≤$T_d$≤0.9 µs. As another example, all $N_d$ values may be swept that satisfy the $T_d$ condition to find the minimum in |n'−n|.

In any case, control next passes to block 740 where the frequency dividers may be controlled based upon the determined ratios. Still further, at block 750 one or more counters of a pulse generator may be controlled based upon the delay counter value. As such, when enabled during operation when pulses are to be generated (namely when an output voltage of a voltage regulator falls below a given threshold), these one or more counters may be configured to be clocked by the retiming clock signal to count at the retiming clock frequency, such that when the delay counter value is reached, the second pulse of the two pulses is generated.

Figure 8:
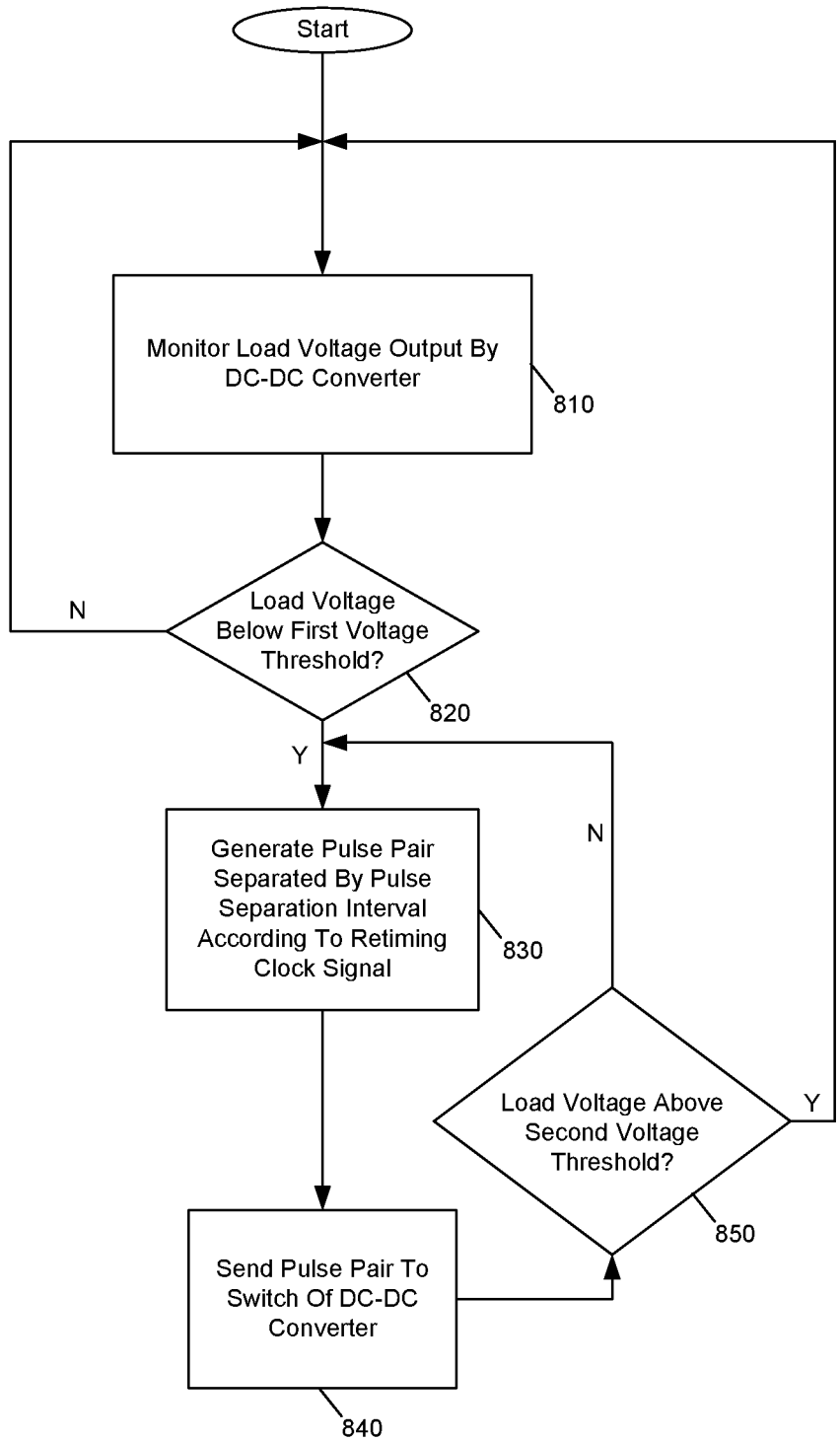
FIG. 8 is a flow diagram of a method in accordance with another embodiment.

Referring now to FIG. 8, shown is a flow diagram of a method in accordance with another embodiment. More specifically, method 800 of FIG. 8 details control operations for a DC-DC converter as described herein. As illustrated, method 800 begins by monitoring a load voltage output by the DC-DC converter (block 810). As an example, a feedback loop can receive the load voltage and compare it to a given threshold.

More specifically, as illustrated at diamond 820 it can be determined in such comparator whether this load voltage is below a first voltage threshold. In an embodiment, understand that this first threshold voltage may be a low threshold level. If the load voltage is above this first threshold voltage, no further operation occurs for this comparison cycle. Accordingly, control passes back to block 810, for another iteration of method 800, e.g., according to a comparator sampling frequency.

Still with reference to FIG. 8, if it is determined that the load voltage falls below the first voltage threshold, control passes to block 830 where a pulse pair as described herein is generated. More specifically, this pulse pair may be generated with a pulse separation interval between the two pulses that is according to the retiming clock signal (e.g., when a counter that counts according to the retiming clock signal reaches a delay counter value). Understand that the time duration of this pulse separation interval may be determined according to one or more of LO frequency and/or an IF frequency (which in turn may be determined based at least in part on an RF band, and channel bandwidth). Next, control passes to block 840 where the pulse pair is sent from the control logic to a switch of the voltage converter, such as a tri-state inverter or one or more MOSFETs to enable a source voltage such as a battery voltage to couple to an inductor of the DC-DC converter. Next after both pulses have been generated such that the inductor current linearly increases and decreases (to a zero Ampere level) twice, control passes to diamond 850 to determine whether the load voltage is above a second voltage threshold. Understand that this second threshold voltage may be at a higher level than the first threshold voltage level to provide a measure of hysteresis. If it is determined that the load voltage is above the second threshold level, no further control operations occur for this comparison cycle, and control passes back to block 810. Otherwise if it determined that the load voltage is not above the second voltage threshold, at least one additional pulse pair may be generated (and where these pulses are separated by the pulse separation interval). Understand while shown at this high level in the illustration of FIG. 8, many variations and alternatives are possible. Note further that the methods described in FIGS. 7 and 8 may be performed in a given microcontroller, processor, or other programmable logic circuitry in response to execution of one or more instructions stored in one or more non-transitory storage media.

Embodiments may thus perform pulse pairing with a retiming clock ($f_{clk}$) at a relatively low frequency, where $f_{clk}/f_{LO}$=a/b. If a is the ratio of the master clock frequency ($f_{master}$) to the LO frequency ($f_{LO}$), the number of zero crossings where the RF frequency ($f_{RF}$=$f_{LO}$−$f_{IF}$) roughly at one of the notches created by pulse pairing, is a for 0<$f_{IF} T_d$≤1. Therefore, there are different values for $f_{IF}$ for the same delay ($T_d$) between pulses that satisfy the condition of perfect alignment of the notch at $f_{RF}$.

Noisy blocks such as a DC-DC converter may affect the sensitivity of RF receivers. Embodiments can be used to create a programmable notch at a given RF frequency of interest. More so, this notch can be generated where the constraint governing the relation between the $f_{IF}$ and $T_d$ between the two pulses is relaxed. For example, different values of $f_{IF}$ can be used for the same value of $T_d$. Furthermore, the retiming clock frequency ($f_{clk}$) can be much lower than the LO frequency ($f_{LO}$). Note that embodiments may be applied to numerous systems that have repetitive transient responses such as for GPIO communication, class-D audio amplifiers or so forth.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a radio receiver to receive and downconvert a radio frequency (RF) signal to a second frequency signal, the radio receiver comprising:
   a programmable frequency synthesizer to generate a first clock signal;
   a first frequency divider to divide the first clock signal to generate a master clock signal;
   a second frequency divider to divide the master clock signal to generate a mixing signal; and
   a mixer to downconvert the RF signal to the second frequency signal using the mixing signal;
a voltage converter to receive a first voltage and provide a second voltage to at least a portion of the radio receiver, the voltage converter having a storage device to store energy based on the first voltage and a switch controllable to switchably couple the first voltage to the storage device; and
a pulse generator to generate at least one pulse pair formed of a first pulse and a second pulse substantially identical to the first pulse, when the second voltage is less than a first threshold voltage, the second pulse separated from the first pulse by a pulse separation interval, wherein the at least one pulse pair is to control the switch.

2. The apparatus of claim 1, wherein the pulse separation interval comprises a predetermined value determined without reference to a determination that the second voltage is less than the first threshold voltage.

3. The apparatus of claim 1, wherein the master clock signal comprises a retiming clock signal to clock at least one counter of the pulse generator, the pulse separation interval determined according to a value of the at least one counter.

4. The apparatus of claim 3, further comprising a third frequency divider to divide the master clock signal to generate a retiming clock signal to clock the at least one counter.

5. The apparatus of claim 1, wherein the second frequency divider comprises a programmable divider, wherein a product of the pulse separation interval and the second frequency signal is approximated to (½−k/a), wherein k is an integer value and a is a divider ratio of the second frequency divider.

6. The apparatus of claim 5, wherein a frequency difference between the RF signal and a null frequency is proportional to an error value of a rounding function.

7. The apparatus of claim 5, wherein a is selectable based at least in part on a frequency of the RF signal.

8. The apparatus of claim 1, wherein the pulse generator comprises a counter to be clocked by the master clock signal, the pulse generator to separate the second pulse from the first pulse according to a value of the counter.

9. The apparatus of claim 8, further comprising a third frequency divider to divide the master clock signal to generate a retiming clock signal.

10. The apparatus of claim 9, wherein at least one of the second frequency divider and the third frequency divider comprises a programmable divider, wherein a product of the pulse separation interval and the second frequency signal is approximated to (½−k/a), wherein k is an integer value, a is a divider ratio of the second frequency divider and b is a divider ratio of the third frequency divider, wherein a and b comprise integer values having no common factor other than one, the counter to be clocked by the retiming clock signal.

11. The apparatus of claim 1, wherein the second frequency divider is programmable to output the mixing signal at a plurality of frequencies for a single value of the pulse separation interval.

12. The apparatus of claim 1, wherein the programmable frequency synthesizer and the second frequency divider are to be programmably controlled to output the mixing signal based at least in part on a wireless communication protocol.

13. At least one non-transitory computer readable storage medium comprising instructions that when executed enable a system to:
determine an output frequency for a frequency synthesizer of a radio receiver, a first divider ratio for a first frequency divider of the radio receiver and an intermediate frequency at which the radio receiver is to operate, based at least in part on a radio frequency (RF) band and a channel bandwidth associated with the RF band;
determine a second divider ratio for a second frequency divider of the radio receiver and a delay counter value based at least in part on the first divider ratio, the intermediate frequency, and a local oscillator frequency, the local oscillator frequency of a mixing signal to downconvert an RF signal to the intermediate frequency;
control the first frequency divider based on the first divider ratio and control the second frequency divider based on the second divider ratio; and
control a counter of a pulse generator according to a retiming clock signal output by the second frequency divider.

14. The non-transitory computer readable storage medium of claim 13, further comprising instructions that when executed enable the system to access a non-volatile storage to obtain one or more of the first divider ratio and the second divider ratio.

15. The non-transitory computer readable storage medium of claim 13, wherein:
control of the first frequency divider comprises causing the first frequency divider to divide an incoming clock signal by the first divider ratio, the first frequency divider to output the mixing signal at the local oscillator frequency; and
control of the second frequency divider comprises causing the second frequency divider to divide the incoming clock signal by the second divider ratio, the second frequency divider to output the retiming clock signal, wherein a first integer value comprising the first divider ratio and a second integer value comprising the second divider ratio have no common factor except one.

16. The non-transitory computer readable storage medium of claim 15, wherein control of the counter comprises clocking at least one counter according to the retiming clock signal and causing the pulse generator to generate a second pulse following a first pulse when a value of the at least one counter reaches the delay counter value.

17. An integrated circuit comprising:
a radio receiver to receive, process and downconvert a radio frequency (RF) signal including an RF channel to a second frequency signal using a mixing signal, at least one of the second frequency signal and the mixing signal programmable;
a digital processor to digitally process the second frequency signal; and
a DC-DC converter including a storage device, the DC-DC converter to provide a voltage to the radio receiver, wherein the DC-DC converter includes a control circuit, when the voltage is less than a threshold voltage, to generate at least one pulse pair formed of a first pulse and a second pulse separated from the first pulse by a pulse separation interval based on a delay counter value, to cause a source voltage to charge the storage device, the delay counter value determined according to a first divider ratio of a first frequency divider that is to generate the mixing signal, a frequency of the mixing signal and a frequency of the second frequency signal, wherein the at least one pulse pair is to reduce interference at one or more of the RF channel and the mixing signal.

18. The integrated circuit of claim 17, wherein the control circuit comprises:
at least one counter to count according to a retiming clock signal, the retiming clock signal output by a second frequency divider having a second divider ratio; and
a pulse generator to generate the first pulse and thereafter generate the second pulse when a count value of the at least one counter reaches the delay counter value.

19. The integrated circuit of claim 18, wherein the first divider ratio comprises a first integer value and the second divider ratio comprises a second integer value, the first integer value and the second integer value having no common factor except one.

20. The integrated circuit of claim 19, further comprising a controller to dynamically determine the first integer value and the second integer value based at least in part on a frequency of the RF signal and a bandwidth of the RF channel.

* * * * *